United States Patent
Shang et al.

(10) Patent No.: US 9,226,391 B2
(45) Date of Patent: Dec. 29, 2015

(54) SUBSTRATES HAVING VOLTAGE SWITCHABLE DIELECTRIC MATERIALS

(75) Inventors: Shurui Shang, San Jose, CA (US); Robert Fleming, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 201 days.

(21) Appl. No.: 12/976,236

(22) Filed: Dec. 22, 2010

(65) Prior Publication Data
US 2011/0132647 A1    Jun. 9, 2011

Related U.S. Application Data

(63) Continuation-in-part of application No. 12/694,702, filed on Jan. 27, 2010, now Pat. No. 8,399,773.

(60) Provisional application No. 61/147,730, filed on Jan. 27, 2009.

(51) Int. Cl.
| | |
|---|---|
| H05K 1/00 | (2006.01) |
| H05K 3/00 | (2006.01) |
| H05K 1/02 | (2006.01) |
| H05K 1/03 | (2006.01) |

(52) U.S. Cl.
CPC ............ *H05K 1/0271* (2013.01); *H05K 1/0259* (2013.01); *H05K 1/036* (2013.01); *H05K 1/0373* (2013.01); *H05K 3/0005* (2013.01); *H05K 2201/068* (2013.01); *H05K 2201/0738* (2013.01); *H05K 2201/09136* (2013.01); *Y10T 29/49124* (2015.01)

(58) Field of Classification Search
CPC ............................ H05K 1/0259; H05K 1/0271
USPC ..................................... 174/258, 259; 29/829
See application file for complete search history.

(56) References Cited

U.S. PATENT DOCUMENTS

| | | | |
|---|---|---|---|
| 3,347,724 | A | 10/1967 | Schneble, Jr. et al. |
| 3,685,026 | A | 8/1972 | Wakabayashi et al. |
| 3,685,028 | A | 8/1972 | Wakabayashi et al. |
| 3,723,635 | A | 3/1973 | Smith |
| 3,808,576 | A | 4/1974 | Castonguay et al. |
| 3,926,916 | A | 12/1975 | Mastrangelo |
| 3,977,957 | A | 8/1976 | Kosowsky et al. |
| 4,113,899 | A | 9/1978 | Henry et al. |
| 4,133,735 | A | 1/1979 | Afromowitz et al. |
| 4,252,692 | A | 2/1981 | Taylor et al. |
| 4,269,672 | A | 5/1981 | Inoue |

(Continued)

FOREIGN PATENT DOCUMENTS

| | | |
|---|---|---|
| JP | 56091464 A | 7/1981 |
| WO | WO9726665 A1 | 7/1997 |

(Continued)

*Primary Examiner* — William H Mayo, III
*Assistant Examiner* — Hiram E Gonzalez
(74) *Attorney, Agent, or Firm* — Kacvinsky Daisak Bluni PLLC

(57) ABSTRACT

Various aspects provide for incorporating a VSDM into a substrate to create an ESD-protected substrate. In some cases, a VSDM is incorporated in a manner that results in the ESD-protected substrate meeting one or more specifications (e.g., thickness, planarity, and the like) for various subsequent processes or applications. Various aspects provide for designing a substrate (e.g., a PCB) incorporating a VSDM, and adjusting one or more aspects of the substrate to design a balanced, ESD-protected substrate. Certain embodiments include molding a substrate having a VSDM layer into a first shape.

14 Claims, 13 Drawing Sheets

(56) References Cited

U.S. PATENT DOCUMENTS

| | | | |
|---|---|---|---|
| 4,331,948 | A | 5/1982 | Malinaric et al. |
| 4,359,414 | A | 11/1982 | Mastrangelo |
| 4,405,432 | A | 9/1983 | Kosowsky |
| 4,439,809 | A | 3/1984 | Weight et al. |
| 4,506,285 | A | 3/1985 | Einzinger et al. |
| 4,591,411 | A | 5/1986 | Reimann |
| 4,642,160 | A | 2/1987 | Burgess |
| 4,702,860 | A | 10/1987 | Kinderov et al. |
| 4,714,952 | A | 12/1987 | Takekawa et al. |
| 4,726,877 | A | 2/1988 | Fryd et al. |
| 4,726,991 | A | 2/1988 | Hyatt et al. |
| 4,799,128 | A | 1/1989 | Chen |
| 4,888,574 | A | 12/1989 | Rice et al. |
| 4,892,776 | A | 1/1990 | Rice |
| 4,918,033 | A | 4/1990 | Bartha et al. |
| 4,928,199 | A | 5/1990 | Diaz et al. |
| 4,935,584 | A | 6/1990 | Boggs |
| 4,977,357 | A | 12/1990 | Shrier |
| 4,992,333 | A | 2/1991 | Hyatt |
| 4,996,945 | A | 3/1991 | Dix, Jr. |
| 5,068,634 | A | 11/1991 | Shrier |
| 5,092,032 | A | 3/1992 | Murakami |
| 5,095,626 | A | 3/1992 | Kitamura et al. |
| 5,099,380 | A | 3/1992 | Childers et al. |
| 5,142,263 | A | 8/1992 | Childers et al. |
| 5,148,355 | A | 9/1992 | Lowe et al. |
| 5,167,778 | A | 12/1992 | Kaneko et al. |
| 5,183,698 | A | 2/1993 | Stephenson et al. |
| 5,189,387 | A | 2/1993 | Childers et al. |
| 5,246,388 | A | 9/1993 | Collins et al. |
| 5,248,517 | A | 9/1993 | Shrier et al. |
| 5,252,195 | A | 10/1993 | Kobayashi et al. |
| 5,260,848 | A | 11/1993 | Childers |
| 5,262,754 | A | 11/1993 | Collins |
| 5,278,535 | A | 1/1994 | Xu et al. |
| 5,282,312 | A | 2/1994 | DiStefano et al. |
| 5,294,374 | A | 3/1994 | Martinez et al. |
| 5,295,297 | A | 3/1994 | Kitamura et al. |
| 5,300,208 | A | 4/1994 | Angelopoulos et al. |
| 5,317,801 | A | 6/1994 | Tanaka et al. |
| 5,340,641 | A | 8/1994 | Xu |
| 5,347,258 | A | 9/1994 | Howard et al. |
| 5,354,712 | A | 10/1994 | Ho et al. |
| 5,367,764 | A | 11/1994 | DiStefano et al. |
| 5,378,858 | A | 1/1995 | Bruckner et al. |
| 5,380,679 | A | 1/1995 | Kano |
| 5,393,597 | A | 2/1995 | Childers et al. |
| 5,403,208 | A | 4/1995 | Felcman et al. |
| 5,404,637 | A | 4/1995 | Kawakami |
| 5,413,694 | A | 5/1995 | Dixon et al. |
| 5,416,662 | A | 5/1995 | Kurasawa et al. |
| 5,440,075 | A | 8/1995 | Kawakita et al. |
| 5,444,593 | A | 8/1995 | Allina |
| 5,476,471 | A | 12/1995 | Shifrin et al. |
| 5,481,795 | A | 1/1996 | Hatakeyama et al. |
| 5,483,407 | A | 1/1996 | Anastasio et al. |
| 5,487,218 | A | 1/1996 | Bhatt et al. |
| 5,493,146 | A | 2/1996 | Pramanik et al. |
| 5,501,350 | A | 3/1996 | Yoshida et al. |
| 5,502,889 | A | 4/1996 | Casson et al. |
| 5,510,629 | A | 4/1996 | Karpovich et al. |
| 5,550,400 | A | 8/1996 | Takagi et al. |
| 5,557,136 | A | 9/1996 | Gordon et al. |
| 5,654,564 | A | 8/1997 | Mohsen |
| 5,669,381 | A | 9/1997 | Hyatt |
| 5,685,070 | A | 11/1997 | Alpaugh et al. |
| 5,708,298 | A | 1/1998 | Masayuki et al. |
| 5,714,794 | A | 2/1998 | Tsuyama et al. |
| 5,734,188 | A | 3/1998 | Murata et al. |
| 5,744,759 | A | 4/1998 | Ameen et al. |
| 5,781,395 | A | 7/1998 | Hyatt |
| 5,802,714 | A | 9/1998 | Kobayashi et al. |
| 5,807,509 | A | 9/1998 | Shrier et al. |
| 5,808,351 | A | 9/1998 | Nathan et al. |
| 5,834,160 | A | 11/1998 | Ferry et al. |
| 5,834,824 | A | 11/1998 | Shepherd et al. |
| 5,834,893 | A | 11/1998 | Bulovic et al. |
| 5,848,467 | A | 12/1998 | Khandros et al. |
| 5,856,910 | A | 1/1999 | Yurchenco et al. |
| 5,865,934 | A | 2/1999 | Yamamoto et al. |
| 5,869,869 | A | 2/1999 | Hively |
| 5,874,902 | A | 2/1999 | Heinrich et al. |
| 5,906,042 | A | 5/1999 | Lan et al. |
| 5,910,685 | A | 6/1999 | Watanabe et al. |
| 5,926,951 | A | 7/1999 | Khandros et al. |
| 5,940,683 | A | 8/1999 | Holm et al. |
| 5,946,555 | A | 8/1999 | Crumly et al. |
| 5,955,762 | A | 9/1999 | Hively |
| 5,956,612 | A | 9/1999 | Elliott et al. |
| 5,962,815 | A | 10/1999 | Lan et al. |
| 5,970,321 | A | 10/1999 | Hively |
| 5,972,192 | A | 10/1999 | Dubin et al. |
| 5,977,489 | A | 11/1999 | Crotzer et al. |
| 6,013,358 | A | 1/2000 | Winnett et al. |
| 6,023,028 | A | 2/2000 | Neuhalfen |
| 6,064,094 | A | 5/2000 | Intrater et al. |
| 6,108,184 | A | 8/2000 | Minervini et al. |
| 6,114,672 | A | 9/2000 | Iwasaki |
| 6,130,459 | A | 10/2000 | Intrater |
| 6,160,695 | A | 12/2000 | Winnett et al. |
| 6,172,590 | B1 | 1/2001 | Shrier et al. |
| 6,184,280 | B1 | 2/2001 | Shibuta |
| 6,191,928 | B1 | 2/2001 | Rector et al. |
| 6,198,392 | B1 | 3/2001 | Hahn et al. |
| 6,211,554 | B1 | 4/2001 | Whitney et al. |
| 6,239,687 | B1 | 5/2001 | Shrier et al. |
| 6,251,513 | B1 | 6/2001 | Rector et al. |
| 6,310,752 | B1 | 10/2001 | Shrier et al. |
| 6,316,734 | B1 | 11/2001 | Yang |
| 6,340,789 | B1 | 1/2002 | Petritsch et al. |
| 6,351,011 | B1 | 2/2002 | Whitney et al. |
| 6,373,719 | B1 | 4/2002 | Behling et al. |
| 6,407,411 | B1 | 6/2002 | Wojnarowski et al. |
| 6,433,394 | B1 | 8/2002 | Intrater |
| 6,448,900 | B1 | 9/2002 | Chen |
| 6,455,916 | B1 | 9/2002 | Robinson |
| 6,468,593 | B1 | 10/2002 | Iazawa |
| 6,512,458 | B1 | 1/2003 | Kobayashi et al. |
| 6,534,422 | B1 | 3/2003 | Ichikawa et al. |
| 6,542,065 | B2 | 4/2003 | Shrier et al. |
| 6,549,114 | B2 | 4/2003 | Whitney et al. |
| 6,570,765 | B2 | 5/2003 | Behling et al. |
| 6,593,597 | B2 | 7/2003 | Sheu |
| 6,621,172 | B2 | 9/2003 | Nakayama et al. |
| 6,628,498 | B2 | 9/2003 | Whitney et al. |
| 6,642,297 | B1 | 11/2003 | Hyatt et al. |
| 6,657,532 | B1 | 12/2003 | Shrier et al. |
| 6,677,183 | B2 | 1/2004 | Sakaguchi et al. |
| 6,693,508 | B2 | 2/2004 | Whitney et al. |
| 6,709,944 | B1 | 3/2004 | Durocher et al. |
| 6,741,217 | B2 | 5/2004 | Toncich et al. |
| 6,797,145 | B2 | 9/2004 | Kosowsky |
| 6,882,051 | B2 | 4/2005 | Majumdar et al. |
| 6,903,175 | B2 | 6/2005 | Gore et al. |
| 6,911,676 | B2 | 6/2005 | Yoo |
| 6,916,872 | B2 | 7/2005 | Yadav et al. |
| 6,981,319 | B2 | 1/2006 | Shrier |
| 7,034,652 | B2 | 4/2006 | Whitney et al. |
| 7,049,926 | B2 | 5/2006 | Shrier et al. |
| 7,053,468 | B2 | 5/2006 | Lee |
| 7,064,353 | B2 | 6/2006 | Bhat |
| 7,067,840 | B2 | 6/2006 | Klauk |
| 7,132,697 | B2 | 11/2006 | Weimer et al. |
| 7,132,922 | B2 | 11/2006 | Harris et al. |
| 7,141,184 | B2 | 11/2006 | Chacko et al. |
| 7,173,288 | B2 | 2/2007 | Lee et al. |
| 7,183,891 | B2 | 2/2007 | Harris et al. |
| 7,202,770 | B2 | 4/2007 | Harris et al. |
| 7,205,613 | B2 | 4/2007 | Fjelstand et al. |
| 7,218,492 | B2 | 5/2007 | Shrier |
| 7,279,724 | B2 | 10/2007 | Collins et al. |
| 7,320,762 | B2 | 1/2008 | Greuter et al. |
| 7,341,824 | B2 | 3/2008 | Sexton |
| 7,417,194 | B2 | 8/2008 | Shrier |

(56) References Cited

U.S. PATENT DOCUMENTS

| | | |
|---|---|---|
| 7,446,030 B2 | 11/2008 | Kosowsky |
| 7,488,625 B2 | 2/2009 | Knall |
| 7,492,504 B2 | 2/2009 | Chopra et al. |
| 7,528,467 B2 | 5/2009 | Lee |
| 7,535,462 B2 | 5/2009 | Spath et al. |
| 7,585,434 B2 | 9/2009 | Morita |
| 7,593,203 B2 | 9/2009 | Dudnikov, Jr. et al. |
| 7,609,141 B2 | 10/2009 | Harris et al. |
| 7,872,251 B2 | 1/2011 | Kosowsky et al. |
| 7,923,844 B2 | 4/2011 | Kosowsky |
| 2002/0004258 A1 | 1/2002 | Nakayama et al. |
| 2002/0050912 A1 | 5/2002 | Shrier et al. |
| 2002/0061363 A1 | 5/2002 | Halas et al. |
| 2003/0010960 A1 | 1/2003 | Greuter et al. |
| 2003/0025587 A1 | 2/2003 | Whitney et al. |
| 2003/0079910 A1 | 5/2003 | Kosowsky |
| 2003/0151029 A1 | 8/2003 | Hsu |
| 2003/0218851 A1 | 11/2003 | Harris et al. |
| 2004/0000725 A1 | 1/2004 | Lee |
| 2004/0062041 A1 | 4/2004 | Cross et al. |
| 2004/0063839 A1 | 4/2004 | Kawate et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0201941 A1 | 10/2004 | Harris et al. |
| 2004/0211942 A1 | 10/2004 | Clark et al. |
| 2004/0241894 A1 | 12/2004 | Nagai et al. |
| 2004/0262583 A1 | 12/2004 | Lee et al. |
| 2005/0026334 A1 | 2/2005 | Knall |
| 2005/0039949 A1 | 2/2005 | Kosowsky |
| 2005/0057867 A1 | 3/2005 | Harris et al. |
| 2005/0083163 A1 | 4/2005 | Shrier |
| 2005/0106098 A1 | 5/2005 | Tsang et al. |
| 2005/0121653 A1 | 6/2005 | Chacko |
| 2005/0184387 A1 | 8/2005 | Collins et al. |
| 2005/0218380 A1 | 10/2005 | Gramespacher et al. |
| 2005/0255631 A1 | 11/2005 | Bureau et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0060880 A1 | 3/2006 | Lee et al. |
| 2006/0142455 A1 | 6/2006 | Agarwal |
| 2006/0152334 A1 | 7/2006 | Maercklein et al. |
| 2006/0166474 A1 | 7/2006 | Vereecken et al. |
| 2006/0167139 A1 | 7/2006 | Nelson et al. |
| 2006/0181826 A1 * | 8/2006 | Dudnikov et al. .............. 361/58 |
| 2006/0181827 A1 | 8/2006 | Dudnikov, Jr. et al. |
| 2006/0193093 A1 | 8/2006 | Bertin |
| 2006/0199390 A1 | 9/2006 | Dudnikov, Jr. et al. |
| 2006/0211837 A1 | 9/2006 | Ko et al. |
| 2006/0214156 A1 | 9/2006 | Pan et al. |
| 2006/0234127 A1 | 10/2006 | Kim |
| 2006/0291127 A1 | 12/2006 | Kim et al. |
| 2007/0114640 A1 | 5/2007 | Kosowsky |
| 2007/0116976 A1 | 5/2007 | Tan et al. |
| 2007/0123625 A1 | 5/2007 | Dorade et al. |
| 2007/0139848 A1 | 6/2007 | Harris et al. |
| 2007/0146941 A1 | 6/2007 | Harris et al. |
| 2007/0208243 A1 | 9/2007 | Gabriel et al. |
| 2007/0241458 A1 | 10/2007 | Ding et al. |
| 2008/0045770 A1 | 2/2008 | Sigmund et al. |
| 2008/0047930 A1 | 2/2008 | Blanchet et al. |
| 2008/0073114 A1 | 3/2008 | Kosowsky et al. |
| 2008/0144355 A1 | 6/2008 | Boeve et al. |
| 2008/0278873 A1 | 11/2008 | Leduc et al. |
| 2009/0044970 A1 | 2/2009 | Kosowsky |
| 2009/0151989 A1 * | 6/2009 | Hunrath ...................... 174/257 |
| 2009/0309074 A1 | 12/2009 | Chen et al. |
| 2010/0038119 A1 | 2/2010 | Kosowsky |
| 2010/0038121 A1 | 2/2010 | Kosowsky |
| 2010/0040896 A1 | 2/2010 | Kosowsky |
| 2010/0044079 A1 | 2/2010 | Kosowsky |
| 2010/0044080 A1 | 2/2010 | Kosowsky |
| 2010/0187006 A1 | 7/2010 | Kosowsky et al. |
| 2010/0243302 A1 | 9/2010 | Kosowsky et al. |
| 2010/0270588 A1 | 10/2010 | Kosowsky et al. |
| 2011/0061230 A1 | 3/2011 | Kosowsky |
| 2011/0062388 A1 | 3/2011 | Kosowsky et al. |

FOREIGN PATENT DOCUMENTS

| | | |
|---|---|---|
| WO | WO9924992 A1 | 5/1999 |
| WO | WO02103085 A1 | 12/2002 |

\* cited by examiner

Processing

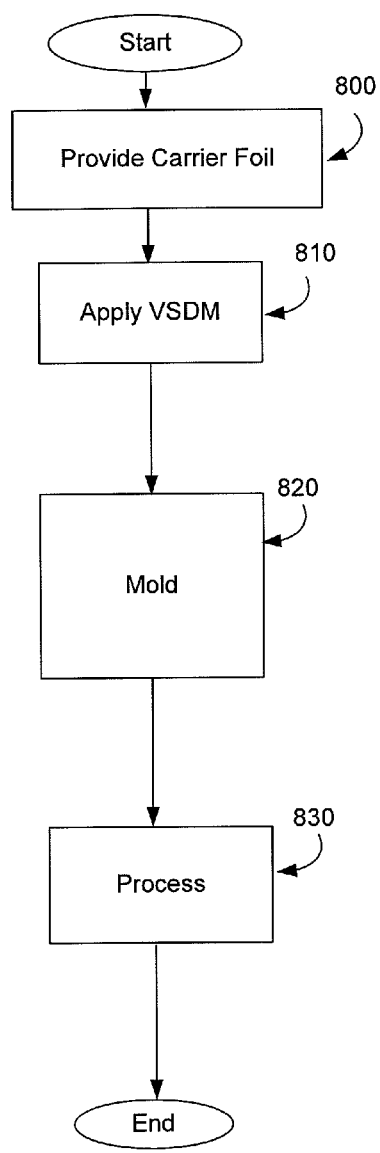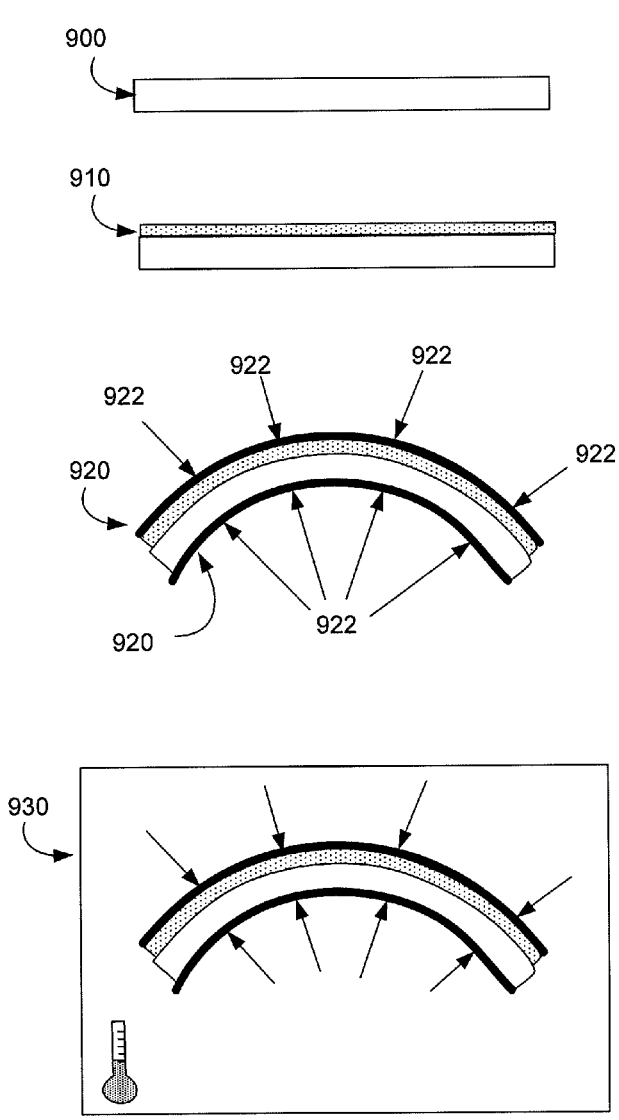
FIG. 8
FIG. 9

SUBSTRATES HAVING VOLTAGE SWITCHABLE DIELECTRIC MATERIALS

CROSS REFERENCE TO RELATED APPLICATIONS

This application is a continuation-in-part and claims the priority benefit of U.S. patent application Ser. No. 12/694,702, filed Jan. 27, 2010 now U.S. Pat. No. 8,399,773, which claims the priority benefit of U.S. provisional patent application No. 61/147,730, filed Jan. 27, 2009 and entitled "Techniques for Reducing Warpage in the Application of VSD Material to Core and Substrate." The disclosure of the aforementioned applications are incorporated by reference herein.

BACKGROUND

1. Technical Field

The present invention relates to designing and fabricating objects that incorporate voltage switchable dielectric materials.

2. Description of Related Art

A printed circuit board, printed wiring board, integrated circuit (IC) package, or similar substrate (hereinafter, PCB) may be used to assemble and connect electronic components. A PCB typically includes a dielectric material and one or more conductive leads to provide electrical conductivity among various attached components, chips, and the like. In some cases, metallic leads may be included (e.g., as a layer of Cu which is subsequently etched) to provide electrical connectivity.

A typical PCB may be fabricated from reinforcements (e.g., glass fibers) that have been pre-impregnated with a matrix (e.g., a polymer resin). A matrix may be combined with (e.g. infiltrated into) the reinforcement while substantially liquid. Handling of the pre-impregnated material may be enhanced by subjecting the matrix to a partial cure (e.g., a B-stage cure) to at least partially solidify the matrix, which may at a later stage be fully cured to a C-stage. A PCB may be fabricated from one or more layers of pre-impregnated material.

A pre-impregnated material is often described as a "prepreg." Prepreg is typically available as a sheet or roll of material, and may be characterized by specifications such as grain (associated with "length" in the roll direction) and fill (associated with "width" in the roll direction). Prepreg may be characterized by various other specifications, such as dimensions (e.g., uncured thickness, cured thickness, and the like), reinforcement material (e.g., glass fibers having a diameter), weave pattern (e.g., of the fibers), matrix composition (e.g., resin composition, % matrix, fillers, and the like), curing protocols, and the like. A type of prepreg may be characterized by a "style," which may summarize one or many parameters describing the prepreg. A style may include a description of the reinforcement type (e.g., woven glass), strand size, weave configuration, density, and the like. Exemplary standard styles include 106, 1080, 2313, 2116, 7628, and the like.

PCB fabrication may include choosing one or more layers of prepreg, stacking the layers, and curing the stacked layers (often with pressure) to form a solid substrate. Vias and/or leads may be incorporated on and/or within a PCB. Prepreg often shrinks during curing, typically in a predictable fashion, and expected shrinkage may be incorporated into a PCB specification. Many prepreg materials are anisotropic, particularly with respect to dimensional changes (e.g., during curing). Dimensional changes may be different in the grain direction than in another direction (e.g., the fill direction).

Many prepreg materials are characterized with one or more specifications for "artwork compensation," which may describe an expected shrinkage during curing. Specifications for artwork compensation are often sufficiently controlled and predictable that they may be incorporated into the PCB design. The artwork compensation specification for a PCB fabricated from a stack of prepregs may often be calculated from the individual prepreg specifications, orientations, and stacking order of the prepreg layers.

A substrate, particularly a thin substrate, may be warped, bent, or otherwise deformed by various processes. In some cases, a substrate may be inadvertently deformed during processing (e.g., during curing of a PCB). A substrate may be warped by external forces. A substrate may be warped by internal elastic forces (e.g., a thermal expansion mismatch between materials).

Viewed in cross-section (i.e., viewing parallel to the plane of a PCB), a PCB may be characterized by a centerline. Typical PCB stacks are designed to be mechanically "balanced" with respect to the centerline, such that forces (e.g., induced during curing and/or cooling from high temperature) above the centerline are cancelled or otherwise opposed by equivalent forces below the centerline. For example, a prepreg layer with a first grain orientation and a first distance above the centerline may be balanced by an equivalent layer having the same grain orientation located the same distance below the centerline. Balancing is often achieved by creating a symmetrical prepreg stack with respect to the centerline. In some cases, the centerline may represent a line of mirror symmetry (at least with respect to mechanical and/or thermal properties), with layers above the centerline being balanced by corresponding "mirror" layers below the centerline.

Various electrical and electronic components may benefit from surge protection, such as protection against electrostatic discharge (ESD) and other electrical events. ESD protection may include incorporating a voltage switchable dielectric material (VSDM). A VSDM may behave as an insulator at a low voltage, and a conductor at a higher voltage. A VSDM may be characterized by a so-called "switching voltage" between these states of low and high conductivity. A VSDM may provide a shunt to ground that protects a circuit and/or component against voltages above the switching voltage by allowing currents at these voltages to pass to ground through the VSDM, rather than through the device being protected.

Many VSDM materials are polymer-based, and may include filled polymers. Processing a VSDM layer on a PCB may cause warping, which may be undesirable. Controlling dimensional changes (e.g., maintaining planarity) may improve the processing of devices incorporating a VSDM, and particularly a layer of VSDM on a thin substrate (whose dimensions may be altered by stress in the VSDM).

FIGS. 1A and 1B illustrate an exemplary unbalanced substrate (e.g., an unbalanced PCB). An unbalanced PCB 100 may be characterized by a centerline 110. A first portion 120 of the PCB (above centerline 120) may not be balanced by a corresponding second portion 130 of the PCB (below centerline 110). In some cases, imbalance may not be manifest until subsequent processing (e.g., curing the PCB and/or cooling from a curing temperature above room temperature). In the example shown in FIG. 1B, PCB 102 has been processed. In processed PCB 102, first portion 122 may have a higher shrinkage (e.g., during curing or cooling) than second portion 132, resulting in warpage of the processed PCB 102.

Voltage switchable dielectric materials may have thermal, elastic, plastic, viscous, and other properties that are different than those of typical prepreg layers. Incorporating a VSDM into a prepreg stack may result in an unbalanced substrate. During various processing steps, imbalance in a substrate may be manifest as loss of dimensional control (e.g., warpage of a PCB).

SUMMARY OF THE INVENTION

Various aspects provide for the incorporation of a voltage switchable dielectric material into a substrate in a manner that results in the substrate meeting various specifications, including dimensionality specifications. In some embodiments, a method for designing a PCB to meet a specification may comprise choosing a first design for a PCB comprising one or more prepreg layers. A first region comprising a VSDM may be incorporated into the first design to create an ESD-protected design. A balance region may be identified, whose incorporation into the ESD-protected design is expected or predicted to balance an imbalance induced by the incorporation of the first region. The balance region may be incorporated into the ESD-protected design to create a balanced, ESD-protected design. The balance region may also provide additional desirable properties. For example, the balance region may be resistive and/or capacitive.

Some designs may be substantially planar (e.g., sufficiently planar to meet a planarity specification or perform in a desired manner). Some designs include a centerline. Certain embodiments include a prepreg stack that does not display mirror symmetry with respect to a centerline associated with the prepreg stack. Some aspects include a balanced, ESD-protected PCB (and or PCB design) that does not have mirror symmetry with respect to a centerline associated with the ESD-protected design.

A first region incorporating a VSDM may be disposed on the same side of the centerline as a balance region. The first region may be on the opposite side of the balance region. The balance region may be on the same side as the first region and opposite side of the centerline. In some cases, a balance region may be disposed a greater distance from the centerline than the first region.

Incorporating a balance region may include adding or subtracting a prepreg layer from a prepreg stack. Incorporating a balance region may include adding a first and subtracting a second prepreg layer from a prepreg stack. In some cases, a balance region comprises a plurality of separate regions. An added prepreg layer may be a different style, thickness, grain orientation, resin content, reinforcement, weave, and/or different in other ways. An added prepreg layer may be the same as another prepreg layer already in a prepreg stack.

Incorporating a balance region may include adding another material to the substrate (e.g., other than another prepreg layer). A balance region may comprise a polymer, a ceramic, a metal, and/or composites thereof. A balance region may include a filled polymer, and may include a second VSDM material. In some cases, a material incorporated into a balance region may be chosen to have similar thermal, elastic, mechanical, or other properties similar to those of the first region incorporating the VSDM.

In some cases, a PCB design may be characterized by an artwork compensation specification, which may be an integrated or averaged value of the artwork compensation specifications of the components (e.g., prepreg layers) from which the PCB is fabricated. In some cases, a balance region may include a material having a larger artwork compensation specification than that of the first design. In certain cases, a balance region may include a material having a larger artwork compensation specification than those of the individual prepreg layers. A balance region may include a material having a larger coefficient of thermal expansion (CTE) than that of the first region and/or the stackup associated with the first design. In certain cases, a balance region may include a material having a larger CTE than those of the individual prepreg layers. A balance region may include a material having a CTE that substantially matches that of the first region. A balance region may include a material having a shrinkage percentage (e.g., a strain associated with shrinkage or expansion due to curing) that substantially matches that of the first region. In some embodiments, a balance region comprises a second VSDM having similar properties and opposite location (in the stack) as compared to the VSDM in the first region.

A printed circuit board may include one or more prepreg layers, and may be characterized by a lack of mirror symmetry associated with a centerline. In some examples, an ESD-protected PCB may include a VSDM. An ESD-protected PCB may be characterized by a lack of mirror symmetry with respect to a centerline associated with the ESD-protected PCB and/or a centerline associated with the one or more prepreg layers.

An ESD-protected PCB may have one or more dimensionality specifications within an industry-defined specification (e.g., IEEE, IEC, IPC, ISO, and the like). Certain ESD-protected substrates (e.g., an ESD-protected PCB) may be characterized by a flatness within a tolerance such as an IPC (*Association Connecting Electronics Industries*) 4101A specification.

Certain aspects provide for molding a substrate comprising a VSDM. In exemplary embodiments, a flexible substrate such as a carrier foil (e.g., a thin polymer, metal, or composite substrate) is provided. A VSDM may be coated on at least a portion of the carrier foil. The coated carrier foil may be formed into a shape (e.g., using a mold). A mold may include planar, parallel plates. A mold may include other shapes, such as a cylinder, sphere, ellipsoid, and the like. A coated substrate may be processed (e.g., cured) while molded. In some cases, curing a coated substrate while in the mold may result in a demolded, cured, coated substrate "springing back" to a shape other than that of the mold. A cylindrically molded substrate (e.g., with the VSDM facing outward) may be cured, cooled and demolded to yield a substantially flat, coated, substrate. A cylinder used for molding may have a diameter between 0.25 and 20 inches, between 0.5 and 10 inches, between 1 and 8 inches, and between 2 and 5 inches.

BRIEF DESCRIPTION OF THE DRAWINGS

FIGS. 8 and 9 illustrate a method and associated structures, according to some embodiments.

DETAILED DESCRIPTION OF THE INVENTION

Various aspects provide for incorporating a VSDM into a substrate to create an ESD-protected substrate. In some cases, a VSDM is incorporated in a manner that results in the ESD-protected substrate meeting one or more specifications (e.g., thickness, planarity, and the like) for various subsequent processes or applications. Various aspects provide for designing a substrate (e.g., a PCB) incorporating a VSDM, and adjusting one or more aspects of the substrate to design a balanced, ESD-protected substrate. Certain embodiments include an ESD-protected substrate (e.g., incorporating a VSDM) that is mechanically and/or elastically balanced, but may not display a structural symmetry (e.g., mirror symmetry) with respect to a centerline through the substrate.

In some embodiments, a specification for a PCB is received, a VSDM is incorporated, and a balance region is incorporated into the design of the PCB to accommodate the incorporation of the VSDM while meeting the specification. Incorporating a balance region may include modifying the structure of the PCB (e.g., an order of a prepreg stackup). Incorporating a balance region may include modifying the components of the PCB (e.g., adding a polymer layer). Incorporating a balance region may include modifying the processing protocol (e.g., ramp rate, dwell time, pressure, and/or temperature associated with curing). Incorporating a balance region may include using forms, shapes, molds, and the like to mold the substrate/VSDM (or PCB) into a shape (e.g., during curing).

A VSDM may be applied as a layer to a carrier foil, which may be a polymer, a metal, a ceramic, a composite, and the like. A VSDM may be applied to a wafer, package, printed circuit board (PCB), printed wiring board (PWB), and the like. For the purposes of this specification, PCB may generally describe a substrate into which a VSDM may be incorporated. As used herein, the term "layer" can include one or more sub-layers, which themselves can constitute a layer. The term "region" is defined similarly.

Figure 1A:
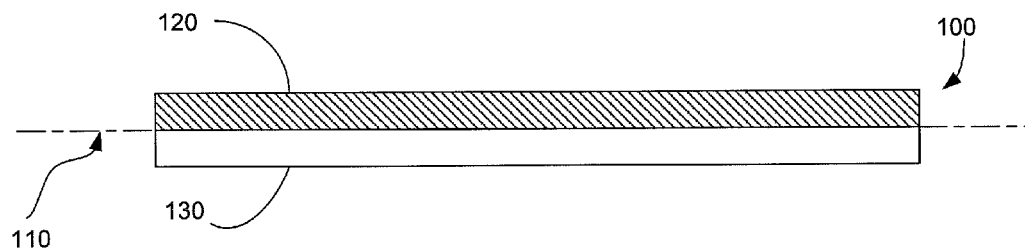
FIGS. 1A and 1B illustrate an exemplary unbalanced substrate (e.g., an unbalanced PCB).
Figure 1B:
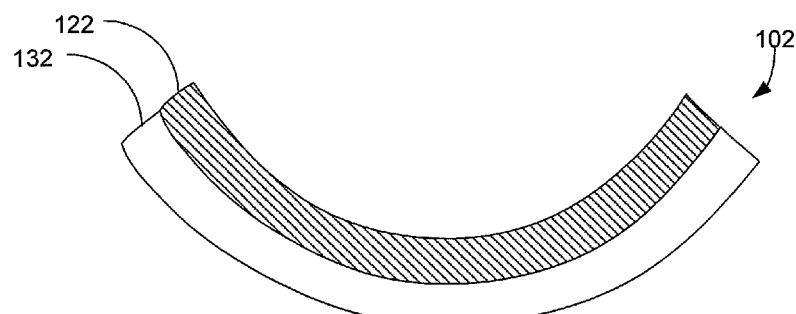
Figure 2A:
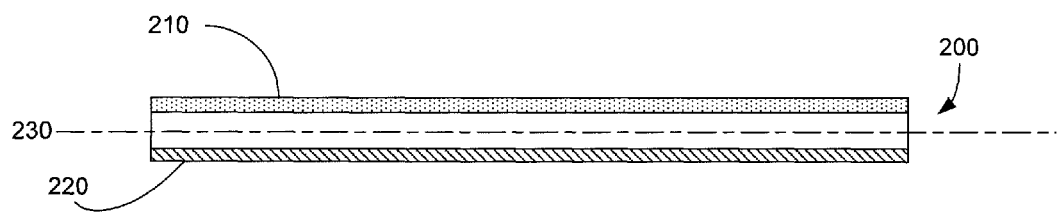
FIGS. 2A and 2B schematically illustrate a balanced substrate incorporating a VSDM, according to some embodiments.
Figure 2B:
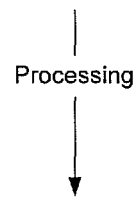
Figure 2B:
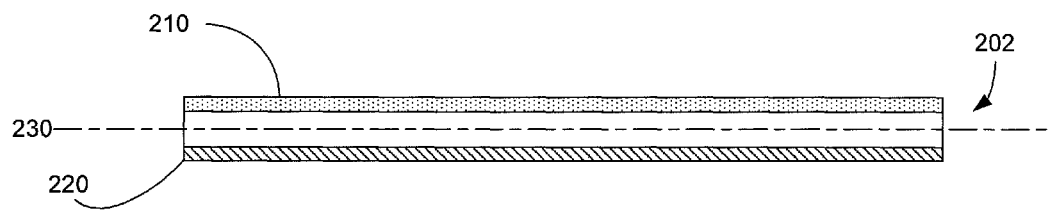

FIGS. 2A and 2B schematically illustrate a balanced substrate incorporating a VSDM, according to some embodiments. Balanced PCB 200 includes a first region 210 incorporating a VSDM. In this example, first region 210 includes a VSDM disposed as a substantially planar layer, which in some cases may be between 0.2 and 5 mils thick, or between 1 and 3 mils thick. A first region may include a VSDM disposed in other geometries (e.g., lines, traces, and other volumes).

A balance region may include a portion of the substrate whose incorporation into the design balances one or more forces induced or associated with the VSDM (e.g., during subsequent processing). A balance region may include one or more additional layers of prepreg. A balance region may include another material (e.g., a polymer, a filled polymer, a VSDM, a resin layer, a reinforcement layer, and the like). A balance region may be characterized by the removal of a layer from the design. A balance region may be planar, and may include shapes other than planer.

In some embodiments, a balance region may be associated with a PCB stackup. Many typical PCB stackups (not incorporating a VSDM) are balanced. A PCB stackup incorporating a balance region may appear "imbalanced" with respect to a centerline, particularly when the inclusion of the VSDM is not accounted for (i.e., the PCB stack, ex-VSDM, may appear unbalanced). Concomitant incorporation of a first region comprising a VSDM and a balance region may result in a balanced PCB design, notwithstanding an apparent imbalance in the PCB stack ex-VSDM. Balanced PCB 200 may include a balance region 220.

In the example shown in FIGS. 2A and 2B, first region 210 may include a VSDM having a larger coefficient of thermal expansion (CTE) than that of other portions of the substrate other than balance region 220. Balance region 220 may have a similar (or the same) CTE as that of first region 210. In this example, first region 210 is disposed above centerline 230, and balance region 220 is disposed below (on the other side of) centerline 230. When first region 210 and balance region 220 have the same CTE, they may be disposed the same distance from centerline 230. When balance region 220 has a smaller CTE than that of first region 210, it may be disposed farther from centerline 230 (and vice versa).

FIG. 2B is a schematic illustration of a processed PCB. In this example, PCB 200 may be processed to form processed PCB 202. Processing may include heating, exposing to light, depositing, etching, ashing, pressing, curing, cutting, engraving, drilling, plating, soldering re-flowing, and the like. Processing may include attaching one or more components, such as resistors, capacitors, inductors, and the like. Processing may include attaching a chip, a package, a system-in-package (SIP), system-on-chip (SOC), and the like.

Processed PCB 202 may meet one or more specifications, such as thickness, flatness, size, thermal properties, dielectric properties, and the like. Some specifications may be standardized, (e.g., by a standards-setting organization), such as ISO, IEEE, IEC, IPC, JEDEC and the like. In some embodiments, a substrate (which may incorporate a VSDM layer) may meet a flatness standard, such as IPC-4101A.

As used herein, the term "flat" refers to processed PCB having a "warpage" of less than or equal to about 13.1% when measured using the following procedure. In the data presented herein, warpage is measured by measuring the maximum vertical displacement of the four corners of an 8"×10" thin core sample with a thickness less than 300 micrometers. The warpage is then computed by dividing the maximum displacement by the average of the length and width of the sample panel. As summarized in the following table, in preferred embodiments the warpage is less than or equal to 8.7%, and most preferably is less than or equal to 4.4%. Due to the thickness and stiffness decrease, thin cores are much more sensitive to mechanical stresses than thick cores.

TABLE 1

Flatness Specification on Thin Cores with Thickness Less than 300 um

| FLATNESS | WARPAGE (MM) | WARPAGE (%) |
| --- | --- | --- |
| MOST PREFERRED | 10 | 4.4 |
| PREFERRED | 20 | 8.7 |

TABLE 1-continued

Flatness Specification on Thin Cores with Thickness Less than 300 um

| FLATNESS | WARPAGE (MM) | WARPAGE (%) |
|---|---|---|
| OK | 30 | 13.1 |
| IPC4101A SPEC FOR LAMINATE WITH THICKNESS, 500 UM < T < 780 UM | N/A | 2.0 |

Figure 3A:
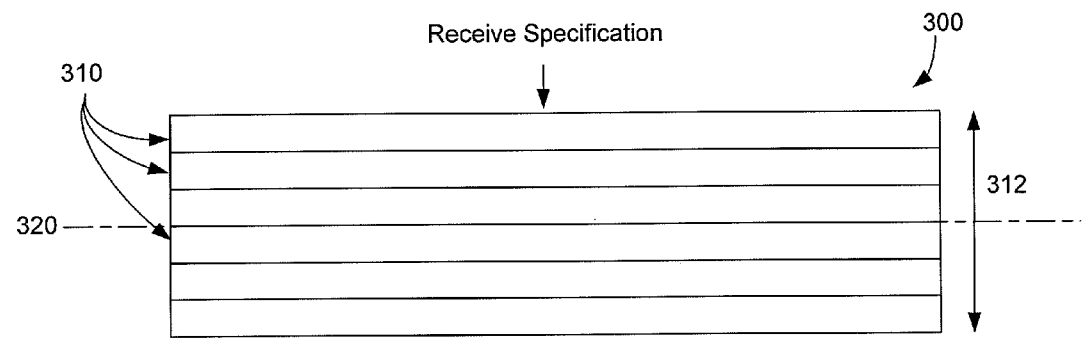
FIGS. 3A, 3B, and 3C illustrate steps and structures associated with designing balanced, ESD-protected substrates, according to some embodiments.
Figure 3B:
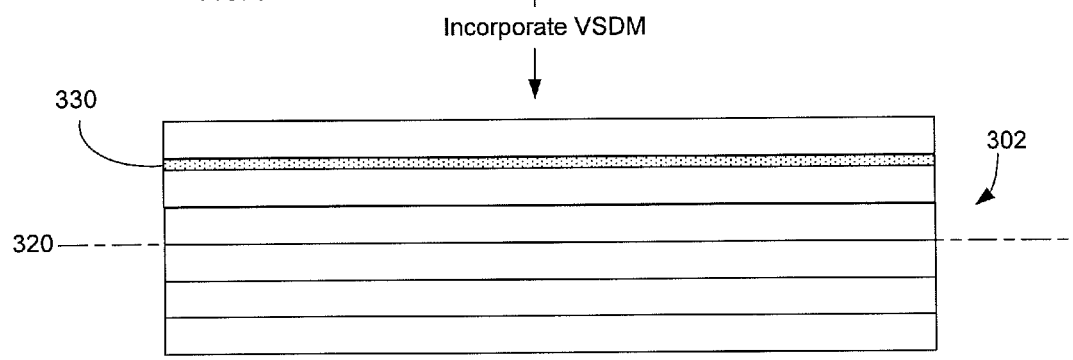
Figure 3C:
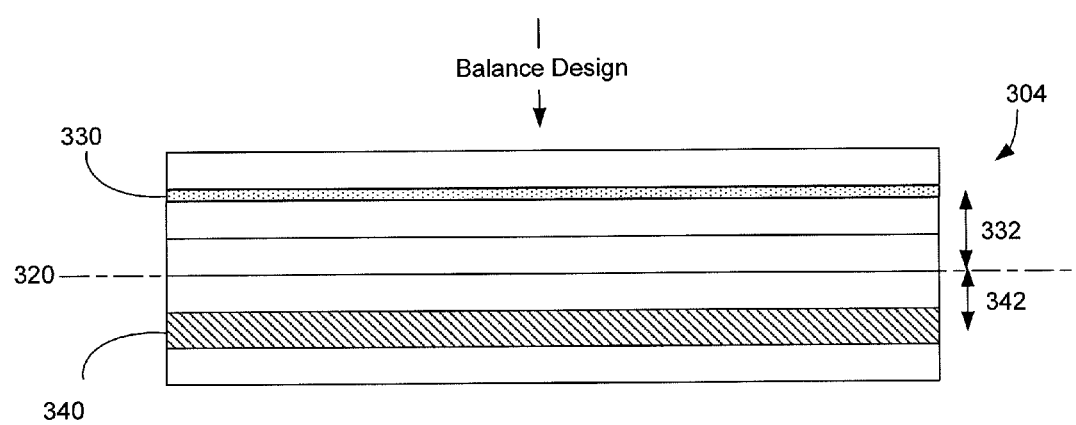

FIGS. 3A, 3B, and 3C illustrate steps and structures associated with designing balanced, ESD-protected substrates, according to some embodiments. A substrate designed for an application may be defined by one or more specifications. In this example, a first substrate design 300 may be a PCB, and may include one or more prepreg layers 310. In some cases, a prepreg stackup may be specified, which may result in a design that includes a centerline 320. In some cases, external properties (e.g., a desired thickness 312) may be specified.

FIG. 3B schematically illustrates a design (that may be unbalanced) for an ESD-protected substrate. ESD-protected substrate design 302 includes a first region 330 that includes a VSDM. A VSDM may (inter alia) protect various circuits attached to the substrate. Protection may include protection against spurious electrical events, such as electrostatic discharge (ESD). For the purposes of this specification, a substrate incorporating a VSDM may be described as an ESD-protected substrate.

FIG. 3C illustrates a balanced, ESD-protected substrate design. In this example, a balanced ESD-protected substrate design 304 includes a first region 330 having a VSDM and a balance region 340. Balance region 340 may "balance" or otherwise counteract various undesirable effects associated with the incorporation of first region 330. Representative, non-limiting effects may include warpage induced by curing the VSDM, dimensional changes associated with CTE mismatch between the first region and other portions of the substrate, and the like. Balanced, ESD-protected substrate design 304 may not display mirror symmetry with respect to centerline 320.

A design may be modified to incorporate a balance region by calculating or otherwise estimating the effects of incorporation of the first region (e.g., the VSDM) on subsequent processing steps. For example, a shrinkage associated with curing of a VSDM may be measured on a test coupon. For a given thickness of VSDM (incorporated into a PCB design), VSDM properties, and associated process of the other materials in the PCB (e.g., prepreg), an expected effect may be calculated (e.g., using a rule of mixtures law and associated geometrical factors). In the example shown in FIG. 3C, the effect of incorporating a first region 330 (e.g., having a first curing shrinkage or first CTE) located a first distance 332 from centerline 320, may be calculated using the stackup geometry and associated properties of the stackup materials. Using computer simulation of one or more possible modifications to the unbalanced design, a type of layer having an appropriate combination of balance region parameters may be chosen that results in a balanced ESD-protected design. For example, designs having layers of different CTE values, thicknesses, distances 342, curing shrinkages, and the like may be simulated (e.g., using Finite Element Modeling of the design to predict properties), and a combination resulting in a balanced ESD-protected substrate may be selected. In some cases, a large number of pseudorandomly selected designs may be simulated (e.g., using Monte-Carlo simulation) and those resulting in the best match to desired properties may be selected.

In an exemplary calculation, a first design may include a first prepreg stackup. A planar first region incorporating a VSDM may be incorporated into the design. In some cases, a thickness, location, switching voltage, shape, and other properties of the first region may be at least partially determined by desired electrical properties (e.g., location of vias, lines, chips, and the like). An expected result of the incorporation may be calculated based on properties of the first region and properties of the prepreg stackup. Exemplary expected results include an expected warpage associated with curing the VSDM or expected warpage associated with cooling of a cured substrate from a higher temperature to room temperature. A balance region may be identified by simulating the addition, subtraction, (and/or both) of additional prepreg layers (and the corresponding effect on final properties). A "goodness of fit" parameter may be maximized such that a simulation is chosen that is most likely to result in desired properties. For example, a plurality of randomly selected additions/subtractions of prepreg layers may be simulated, and those that are most expected to result in a flat substrate after curing and cooling may be chosen. In some embodiments, desired properties (e.g., elastic moduli, curing shrinkage, CTE, thickness, location) of a balance region may be solved for analytically, and an appropriate material having such properties may be chosen and designed into the appropriate location or locations.

Figure 4A:
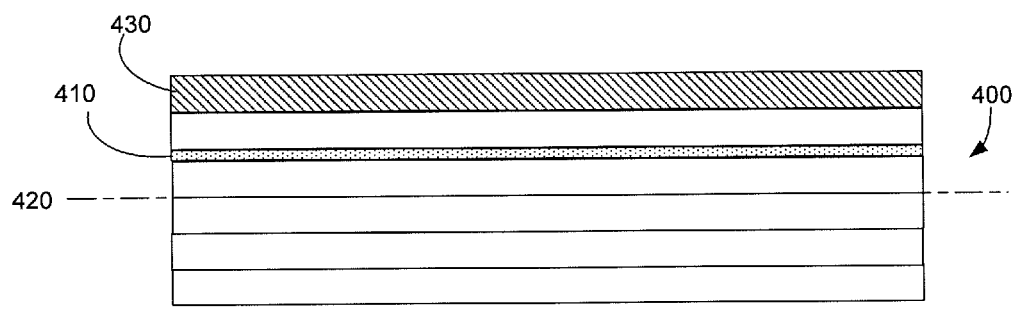
FIGS. 4A, 4B, and 4C schematically illustrate several different balance regions, according to some embodiments.
Figure 4B:
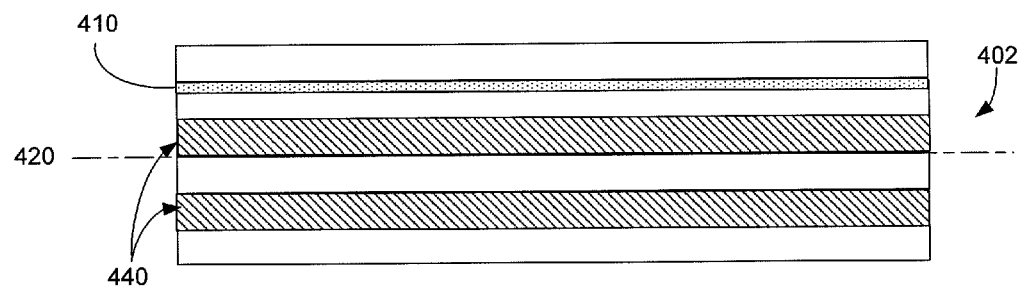
Figure 4C:
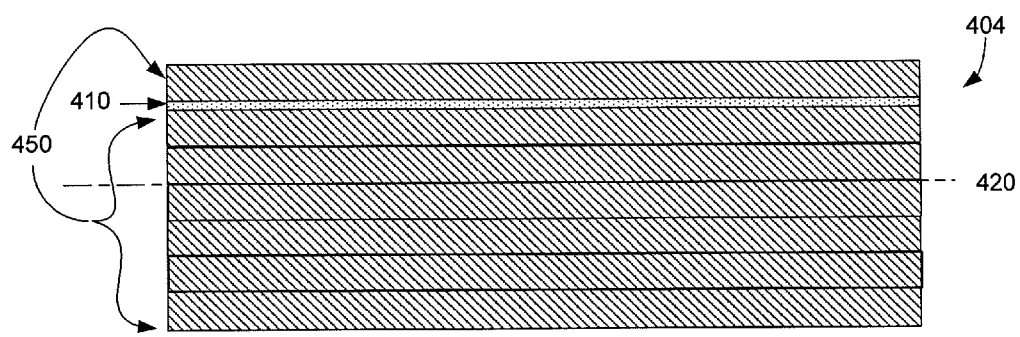

FIGS. 4A, 4B, and 4C schematically illustrate several different balance regions, according to some embodiments. FIG. 4A illustrates a balanced, ESD-protected design for a PCB 400. PCB 400 includes a first region 410 having a VSDM, located on a first side of a centerline 420. A balance region 430 may be at least partially disposed on the same side of the centerline as first region 410. Exemplary balance region 430 may be characterized by a curing shrinkage lower than that of various prepreg layers. Exemplary balance region 430 may have a higher, lower, or similar elastic modulus than that of various prepreg layers.

FIG. 4B illustrates a balanced, ESD-protected design for a PCB 402. PCB 402 includes a first region 410, having a VSDM, located on a first side of a centerline 420. In this example, balance region 440 is partially disposed on an opposite side of the centerline and partially disposed on the same side of the centerline as first region 410.

FIG. 4C illustrates a balanced, ESD-protected design for a PCB 404. PCB 404 includes a first region 410, having a VSDM, located on a first side of a centerline 420. In this example, substantially the entire PCB stackup has been redesigned (e.g., replaced with different prepreg layers) to balance the incorporation of first region 410. Balanced, ESD-protected substrates 400, 402, and 404 may not display mirror symmetry with respect to centerline 420.

Figure 5:
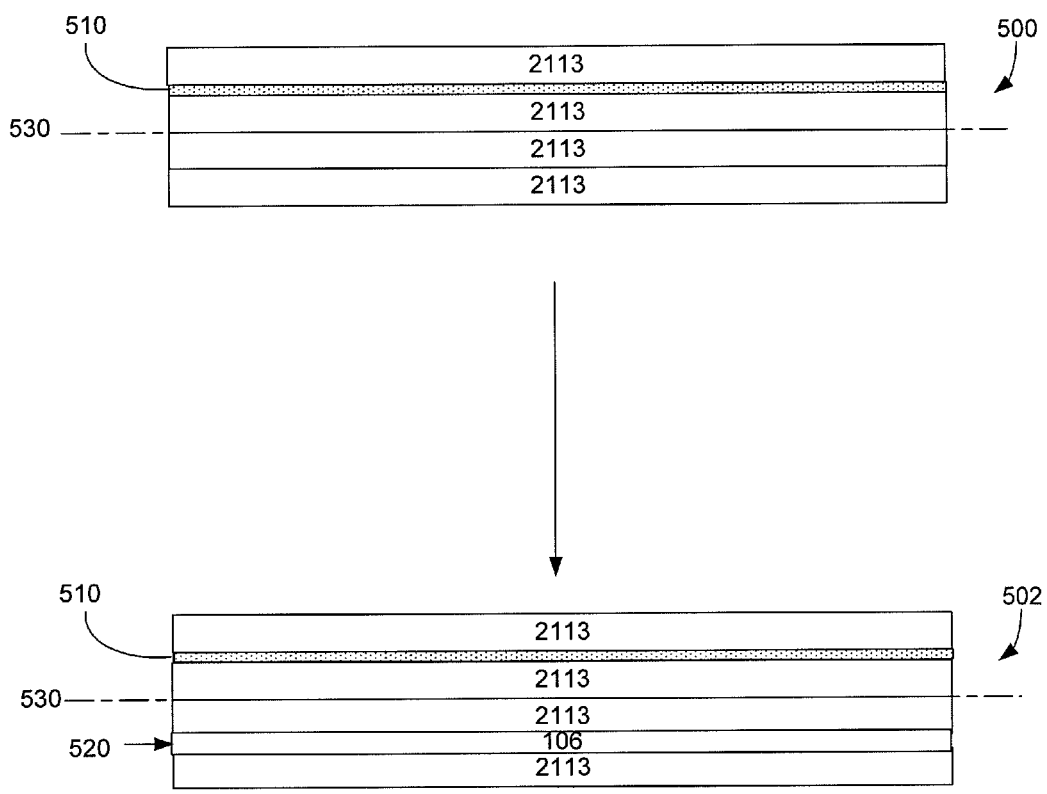
FIG. 5 illustrates an incorporation of a balance region into a PCB design, according to some embodiments.

FIG. 5 illustrates an incorporation of a balance region into a PCB design, according to some embodiments. FIG. 5 illustrates an exemplary incorporation that includes adding a prepreg layer. In this example an ESD-protected substrate 500 may include a first region 510 having a VSDM. In this example, the substrate includes a stack of four style-2113 prepreg layers, with the first region disposed as shown. ESD-protected substrate 500 may be unbalanced.

The design for ESD-protected substrate 500 may be modified to create a design for a balanced, ESD-protected substrate 502. In this example, balanced ESD-protected substrate 502 includes a balance region comprising an additional layer 520 of style 106 prepreg, inserted on the opposite side of the centerline (with respect to first region 510). In this example, additional layer 520 is inserted between the two layers of style 2113 prepreg, opposite the first region 510.

Certain embodiments include adjusting a type associated with a balance region (e.g., a type of prepreg layer). A type may be a multivariable descriptor of one or more (and in some cases, many) characteristics of a material such as a prepreg layer. Type may include a style and/or other parameters characterizing a layer, such as reinforcement (e.g., E-glass), resin type (e.g., epoxy), additional resins (e.g., multistage resins), halogen concentration, curative type, resin content, catalyst, resin filler type and loading, Tg, CTE, permittivity, loss, dielectric constant, modulus, and the like. In some cases, a type may include a standard characteristic (e.g., a style) modified and annotated to further define characteristics (e.g., a halogen-free, two-stage resin of style 106 having a high Tg). Choosing a type may include choosing appropriate prepreg parameters (e.g., resin composition, resin content, filler composition, filler content, curing kinetics, and the like).

Balanced ESD-protected PCB 502 may not display mirror symmetry with respect to the centerline 530, which may be located at a mid-point of the substrate (including the first region 510) or a mid-point of the PCB-stack (not including the first region 510). In some embodiments, the removal of one or more layers of prepreg, to rebalance an imbalanced PCB, may be described as the incorporation of a balance region.

Figure 6:
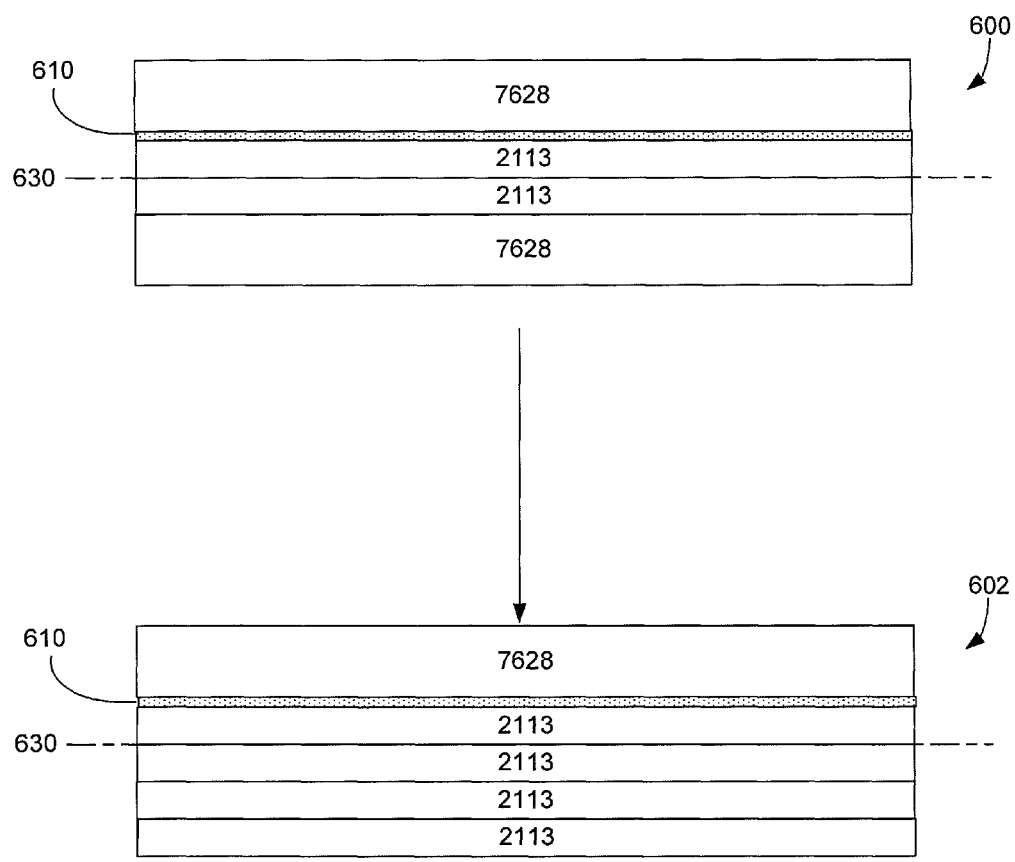
FIG. 6 illustrates an incorporation of a balance region into a PCB design, according to some embodiments.

FIG. 6 illustrates an incorporation of a balance region into a PCB design, according to some embodiments. In this exemplary incorporation, a first prepreg layer is removed and a second prepreg layer is added to a design. ESD-protected PCB 600 includes a first region 610 comprising a VSDM. Excluding the first region 610, the design includes four prepreg layers, layered in styles 7628-2113-centerline-2113-7628. First layer 610 is disposed between the upper 7628 and 2113 prepreg layers. The design for ESD-protected PCB 600 may be unbalanced.

Balanced ESD-protected PCB 602 includes a different prepreg stacking than that of ESD-protected PCB 600. An aspect of this difference may be described as a difference in prepreg layers on the opposite side of first region 610. In this example, the opposite layer of style 7628 prepreg has been swapped for two layers of style 2113 prepreg, resulting in a balanced, ESD-protected PCB. Balanced ESD-protected PCB 602 may not display mirror symmetry with respect to the centerline 630, which may be located at a mid-point of the substrate (including the first region 610) or a mid-point of the PCB-stack (not including the first region 610).

Figure 7:
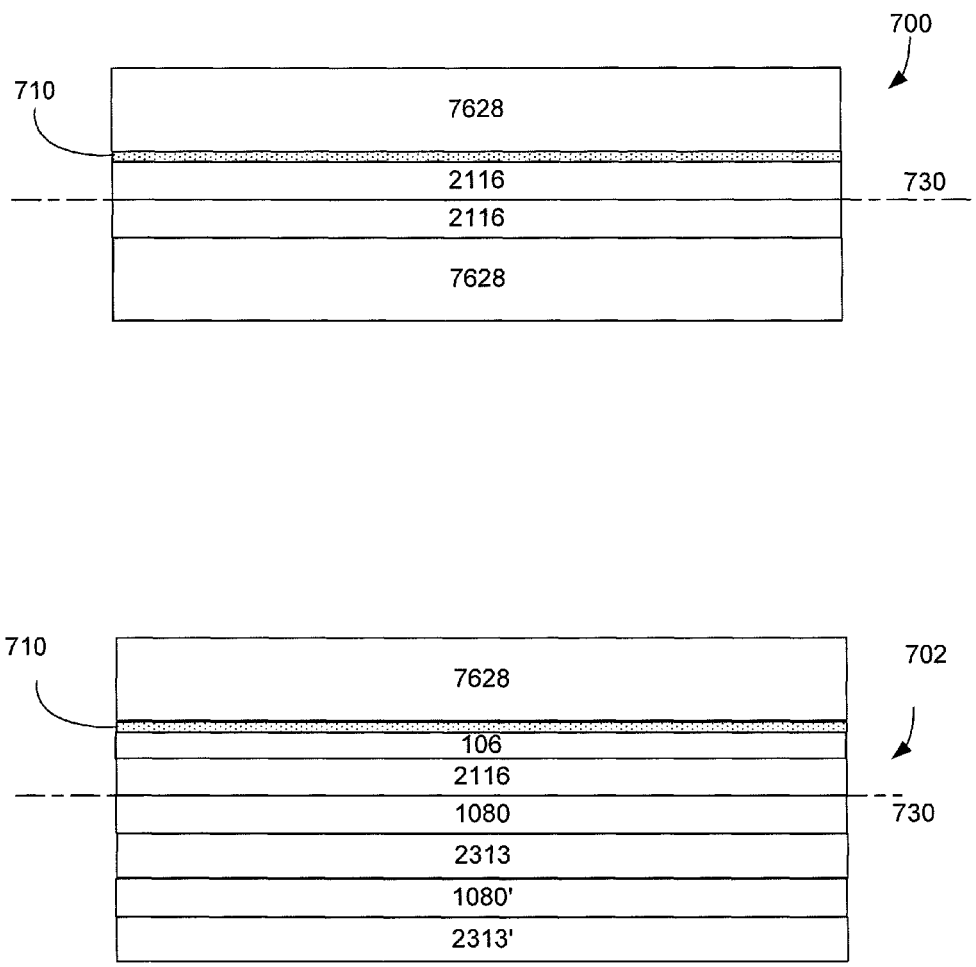
FIG. 7 illustrates an incorporation of a balance region into a PCB design, according to some embodiments.

FIG. 7 illustrates an incorporation of a balance region into a PCB design, according to some embodiments. ESD-protected PCB 700 includes a first region 710 comprising a VSDM. Excluding the first region 710, the design includes four prepreg layers, layered in styles 7628-2116-centerline-2116-7628. First layer 710 is disposed between the upper 7628 and 2116 prepreg layers. The design for ESD-protected PCB 700 may be unbalanced.

Balanced ESD-protected PCB 702 includes a different prepreg stacking than that of ESD-protected PCB 700. Differences include an addition of a prepreg layer on the same side as first region 710, a swapping of prepreg layers on the opposite side of the centerline, and a change in grain orientation of prepreg layers.

In this example, an additional prepreg layer style 106 is added between first region 710 and adjacent prepreg layer style 2116. On the opposite side of the centerline, the styles 2116 and 7628 prepreg layers have been replaced with styles 1080, 2313, 1080', and 2313' in a stacking as shown. In this example, styles 1080 and 1080' have different grain orientations, and styles 2313 and 2313' have different grain orientations. Balanced ESD-protected PCB 702 may not display mirror symmetry with respect to the centerline 730, which may be located at a mid-point of the substrate (including the first region 710) or a mid-point of the PCB-stack (not including the first region 710).

FIGS. 8 and 9 illustrate a method and associated structures, according to some embodiments. FIG. 8 illustrates a method for processing a substrate comprising a VSDM. FIG. 9 illustrates exemplary associated structures.

A carrier foil 900 is provided in step 800. In step 810, a VSDM 910 may be applied to (e.g., coated on) at least a portion of the carrier foil 900. In step 820, the coated carrier foil may be shaped or formed using a mold 920. In some embodiments, an optional drying step may be performed on the coated carrier foil to dry and/or partially cure the VSDM. Molding may include the use of pressure 922. Pressure may be applied via an external component (e.g., mold 920). Pressure may be applied via internally-generated elastic forces. For example, a coated carrier foil may be wrapped around a cylinder. For situations in which the carrier foil has a much higher elastic modulus than that of the VSDM, the VSDM may be constrained to (and sheared by) the shape and size of the carrier foil. A mold may be any shape, including flat (e.g., planar, parallel plates), cylindrical, spherical, hyperbolic, ellipsoidal, parabolic, angled, and other shapes.

In step 830, the coated carrier foil is processed. In some cases, processing may include heating the coated carrier foil to a temperature, which may be performed in an oven 930. In some cases, pressure 922 may be maintained during processing. Processing may include curing, drying, post-cure treatments, exposure to light (e.g., ultraviolet light), vibration, ultrasonication, application of pressure or other forces, bending, stretching, clamping, and the like. In some embodiments, a coated carrier foil may be wrapped around a cylinder (e.g., with the VSDM facing outward), and the wrapped cylinder may be placed in an oven and heated to a curing temperature associated with the VSDM. A residual contraction of the cured VSDM/carrier foil composite (e.g., upon cooling and demolding) may yield a substantially planar carrier foil having a cured VSDM layer thereon.

Figure 10:
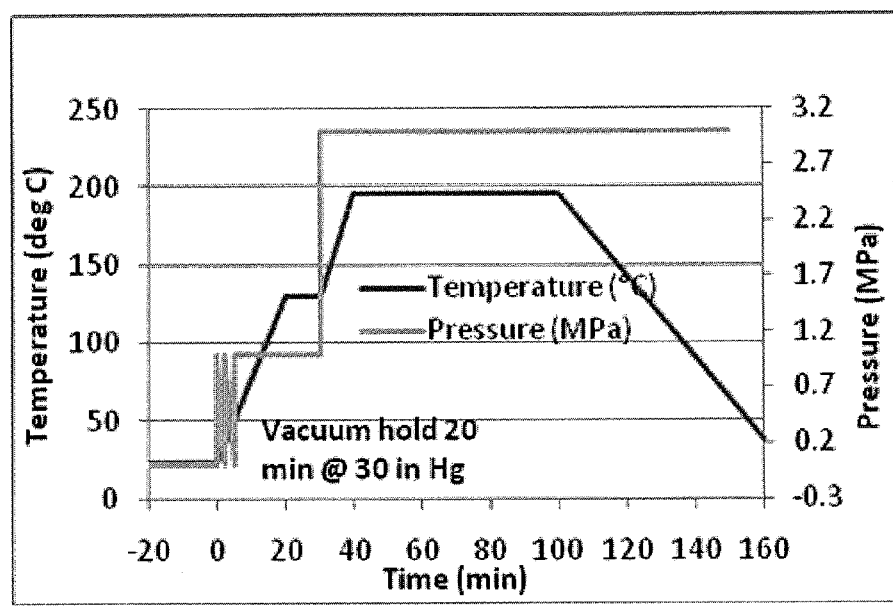
FIG. 10 illustrates exemplary process parameters for laminating a substrate which includes a VSDM, according to some embodiments.

FIG. 10 illustrates exemplary process parameters for laminating the stacked materials which form a processed substrate that includes a VSDM, according to some embodiments.

Figure 11:
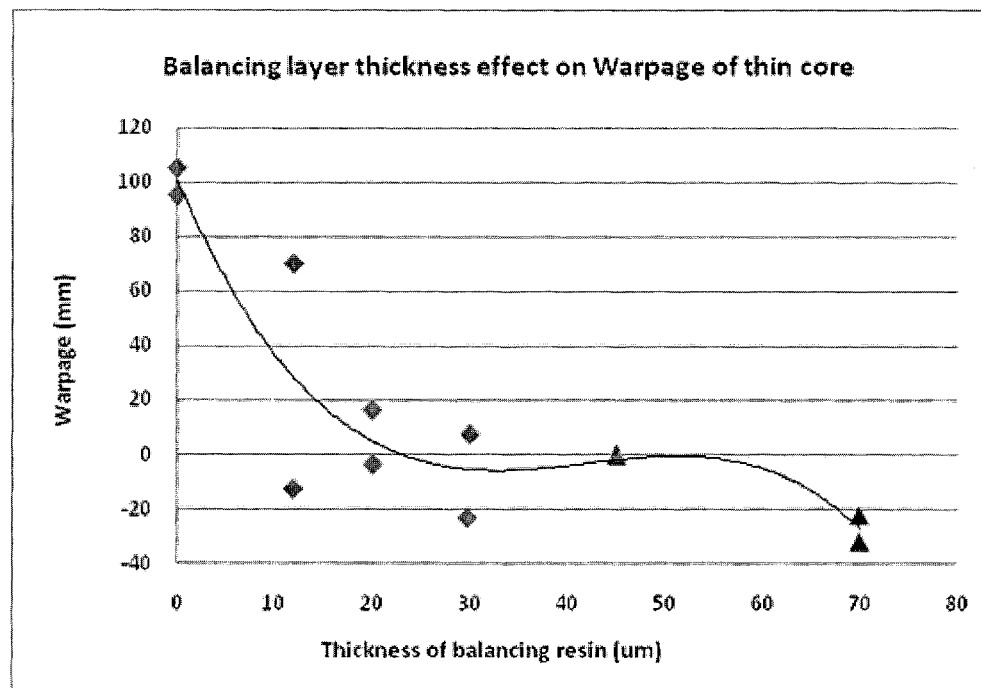
FIG. 11 illustrates measured data of the effect the balancing layer thickness has on the warpage, according to some embodiments.

FIG. 11 illustrates measured data of the effect the balancing layer thickness has on the warpage, according to some embodiments. The data in FIG. 11 was measured for a balanced substrate incorporating a VSDM, with a stack-up structure similar to that illustrated in FIGS. 2A and 2B. Specifically, a VSDM coating, prepregs and Resin Coated Copper (RCC) were stacked up as described in more detail below, and laminated under high temperature and high pressure in accordance with the conditions illustrated in FIG. 10.

The cores after lamination were then cut to a size of 8 inch by 10 inch, then masked and etched the copper off one side at a time using Ferric Chloride Copper Etchant Solution. It will be understood that the warpage issue is amplified by etching the whole copper off instead of etching only the electrical traces.

The warpage (vertical displacement of the corners) was then measured by recording the max displacement of the four corners of the cores laying freely on a leveled flat surface (modified from IPC-TM-650 2.4.22.1 Bow and Twist-Laminate). Cores as it is (with full copper), with only one side of the copper etched off, as well as cores with both sides of the copper being removed are test for warpage.

Due to the unsymmetrical nature of VSDM embedded core, the warpage has directions. As used herein, the warpage is referred to as positive if the four corners warp to the VSDM side of the core; negative if the corners of the core warp to the side without VSD material.

Figure 12:
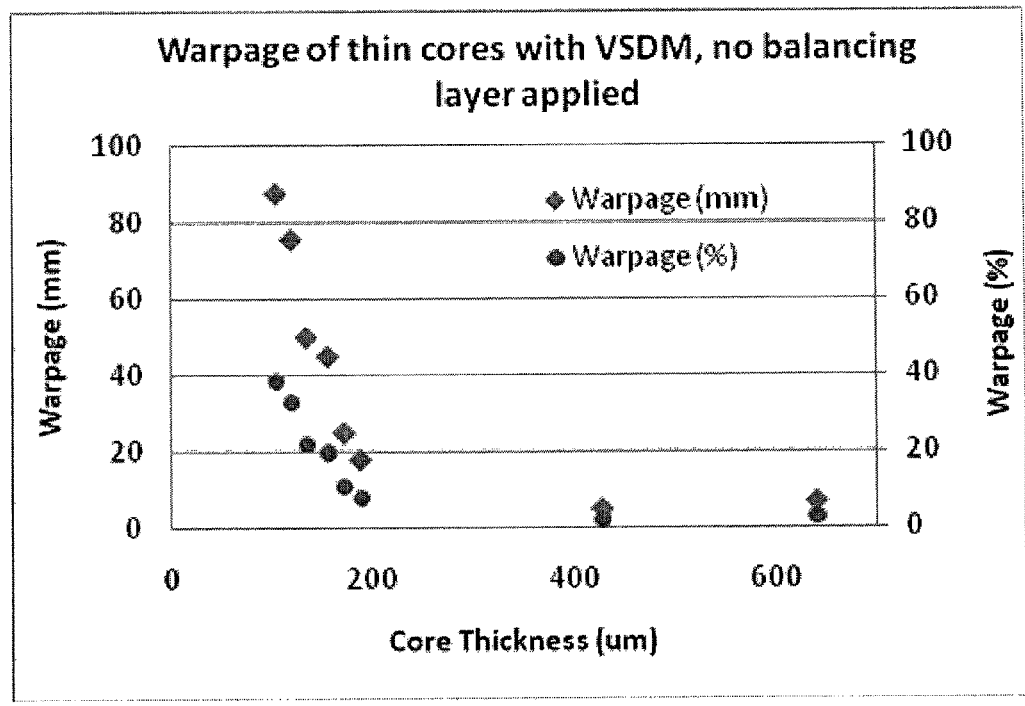
FIG. 12 illustrates measured data of the effect the core thickness has on the warpage of VSDM embedded thin cores without balancing layer.

Control measurements without a balancing layer were made on a substrate having a stack-up from the bottom up of copper having a thickness of about 18 micrometers coated with a VSDM layer having a thickness of about 25 micrometers, various thicknesses of prepreg, and a top layer of copper having a thickness of about 18 micrometers. The table below and FIG. 12 summarize the measured data and demonstrates the relationship between warpage and the thickness of the thin core with VSDM.

TABLE 2

Relationship between Warpage and Thickness of Thin Core with VSDM

| THICKNESS (UM) | WARPAGE WITH COPPER (MM) | (%) | WARPAGE WITH COPPER ETCHED OFF (MM) | (%) |
|---|---|---|---|---|
| 105 | 0 | 0 | 87.5 | 38.3 |
| 120 | 0 | 0 | 75.5 | 33.0 |
| 135 | 0 | 0 | 50 | 21.9 |
| 156 | 0 | 0 | 45 | 19.7 |
| 172 | 0 | 0 | 25 | 10.9 |
| 188 | 0 | 0 | 18 | 7.9 |
| 428 | 4.5 | 2.0 | 5 | 2.2 |
| 641 | 5.6 | 2.5 | 7 | 3.1 |

As can be seen upon review of Table 2 and FIG. 12, thin laminates (cores) with thicknesses less than ~300 um respond to thermal stress (generating between different CTEs of the layered materials bonded together) more dramatically than cores above 300 um. In fact, the warpage of the thin cores increase almost linearly as the decrease of the thickness with a very high slope, while cores that are thicker than 300 um are flat or close to flat, as defined above.

The measurements of the effect of the balancing layer were then made on a substrate having a stack-up from the bottom up of copper having a thickness of about 18 micrometers coated with a VSDM layer having a thickness of about 25 micrometers, 1 or 2 plies of Panasonic R1551V 106 (having a total thickness of about 55 or about 110 micrometers), and a balance region consisting of resin coated copper (RCC) from Oak-Mitsui resin type, MRG200 or other epoxy coated copper of various thicknesses. As used herein, the term "about" is intended to allow for variations in thickness which arise due to process variations.

The stacked materials were laminated under the same conditions as showing in FIG. 10. This RCC balanced VSDM core was sheared, masked and etched. Warpage was then measured as described above. As shown in FIG. 11 for 2 plies of prepreg with 106 glass type, this produced a flat core for a balance region thickness of about 45 micrometers.

It has been observed that the core (without copper) warpage is a function of a combination of young's modulus, thickness and CTE of each layer of materials in the structure. In particular, the warpage depends significantly on the two outer layers, meaning the VSD and the balancing materials. In other words, the balancing material choice and the thickness is a function of the VSD material and thickness, especially when the thickness and material of the center layer (in most case, the prepregs) are predetermined. This can be seen upon review the data in of FIG. 11. It can be seen that a flat core is produced when the right amount of balancing is applied (here for this example VSD material, it is 45 um of MRG200 resin). Too little balancing material will not be able to overcome the warpage towards VSD side, while too much will over balance and results a core warping towards the resin side.

Once the right balancing resin is determined for a particular VSD coating, it has been observed that the material and thickness of the prepregs used has little to no effect on the warpage. In other words, the thicknesses of the balance material and the VSDM which result in a flat core are independent (or substantially independent) of the thickness or type of the prepregs. This observation is supported by the measured results shown in FIG. 13.

Figure 13:
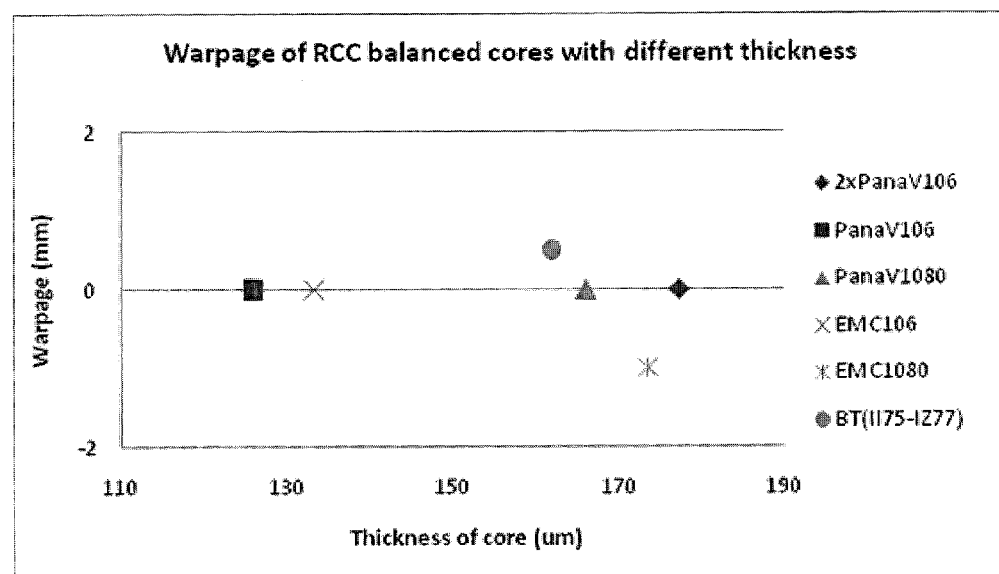
FIG. 13 illustrates measured data of the effect the prepeg material and thickness has on the warpage, according to some embodiments.

FIG. 13 illustrates measured data of the effect the prepeg material and thickness has on the warpage, according to some embodiments. In the measured data, 45 micrometers of MRG200 resin was used to balance VSDM for different core substrates with different prepreg (including Panasonic R1551-V type, EMC 285 type, MGC 832NX-A type) and thickness (range from 125 um to 180 um) combination. As can be seen in FIG. 12, the cores constantly showed very good flatness with warpage which is well within in the PCB specification.

Figure 14:
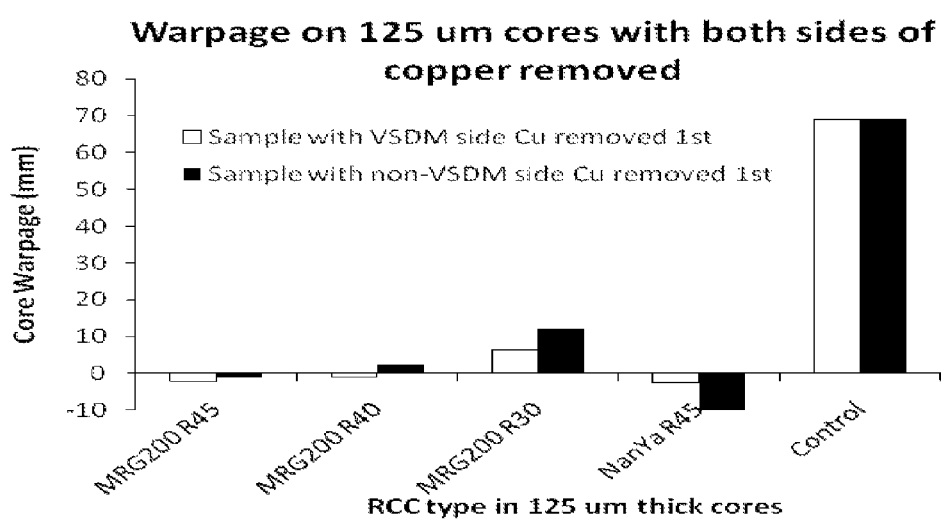
FIG. 14 illustrates measured data of the effect the RCC material and thickness has on the warpage, according to some embodiments.

FIG. 14 illustrates measured data of the effect different types of RCC and thicknesses have on the warpage for a core having a thickness of 125 micrometers, according to some embodiments. The measurements were made on a substrate having a stack-up from the bottom up of copper having a thickness of about 18 micrometers, coated with a VSDM layer having a thickness of about 25 micrometers, 1 ply of EMC 285 106 (having a total thickness of about 55 micrometers), and a balance region consisting of different types of RCC as indicated in FIG. 14.

Some embodiments include adjusting a formulation of a VSDM, which may include changing an epoxy (e.g., type, ratio), curative agent (e.g., type, ratio to epoxy or resin), and/or the addition of other additives to improve balance. Exemplary epoxies include Epon 828, GP611, Polybd, and the like. Exemplary curative agents include Dicyandiamide, Diaminodiphenylsulfone, Nadic methyl anhydrides, and the like.

A first region having a VSDM may consist of the VSDM. A first region may comprise a VSDM and another substance (or gaps, holes, and the like). A first region may be uniform (e.g., planar). A first region may include discrete elements (e.g., disks, lines, wires, and the like).

Some embodiments include sensors to sense various parameters (e.g., thickness, strain, temperature, stress, viscosity, concentration, depth, length, width, thickness, number of layers, coefficient of thermal expansion (CTE), switching voltage and/or voltage density (between insulating and conducting), trigger voltage, clamp voltage, off-state current passage, dielectric constant, time, date, and other characteristics). Various apparatus may monitor various sensors, and systems may be actuated by automated controls (solenoid, pneumatic, piezoelectric, and the like). Some embodiments include a computer readable storage medium coupled to a processor and memory. Executable instructions stored on the computer readable storage medium may be executed by the processor to perform various methods described herein. Sensors and actuators may be coupled to the processor, providing input and receiving instructions associated with various methods. Certain instructions provide for closed-loop control of various parameters via coupled sensors providing input and coupled actuators receiving instructions to adjust parameters. Certain embodiments include materials. Various embodiments include telephones (e.g., cell phones), USBdevices (e.g., a USB-storage device), personal digital assistants, laptop computers, netbook computers, tablet PC computers and the like.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A printed circuit board comprising:
a prepreg layer having a first surface and a second surface;
a voltage switchable dielectric material layer on the first surface of the prepreg layer, the prepreg layer and the voltage switchable dielectric material layer defining a first region subject to warpage when subjected to a particular process comprising at least one of curing, etching, and solder re-flowing subjected to the printed circuit board;
a first balance material layer on the second surface of the prepreg layer, the first balance material layer fully disposed on a same side of a centerline of the printed circuit board as the voltage switchable dielectric material layer, the centerline representing an approximate center of the printed circuit board when viewed parallel to the plane of the printed circuit board; and
a second balance material layer fully disposed on an opposite side of the centerline of the printed circuit board, wherein the first balance material layer is a first distance from the centerline and the second balance material layer is a second distance from the centerline, the second distance greater than the first distance, the prepreg layer and the first balance material layer defining a second region to counteract the warpage of the first region, the warpage is induced and associated with the voltage switchable dielectric material layer, such that the prepreg layer, the voltage switchable dielectric material layer and the first balance material layer define a multi-layer stack which is flat when subjected to the particular process.

2. The printed circuit board of claim 1, wherein at least one of the first and second balance material layers has a thickness dependent upon a thickness of the voltage switchable dielectric material layer.

3. The printed circuit board of claim 1, wherein a thicknesses of at least one of the first and second balance material layers and the voltage switchable dielectric material layer are independent of a thickness of the prepreg layer.

4. The printed circuit board of claim 1, wherein the voltage switchable dielectric material layer has different properties than that of the first balance material layer.

5. The printed circuit board of claim 4, wherein the different properties of the voltage switchable dielectric material layer and the first balance material layer include at least one of a different coefficient of thermal expansion, thickness, and elastic modulus.

6. The printed circuit board of claim 1 wherein:
the prepreg layer has a thickness of about 125 micrometers;
the voltage switchable dielectric material layer has a thickness of about 25 micrometers; and
the first balance material layer has a thickness of about 45 micrometers.

7. The printed circuit board of claim 1, wherein:
the prepreg layer has a thickness of about 55 micrometers;
the voltage switchable dielectric material layer has a thickness of about 25 micrometers; and
the first balance material layer has a thickness of about 45 micrometers.

8. The printed circuit board of claim 1, wherein the prepreg layer has thickness of less than about 300 micrometers.

9. The printed circuit board of claim 1, wherein:
the prepreg layer has a thickness of about 25 micrometers;
the voltage switchable dielectric material layer has a thickness of about 25 micrometers; and
the first balance material layer has a thickness of about 35 micrometers.

10. The printed circuit board of claim 1, wherein one or more layers are disposed between the second balance material layer and the centerline.

11. The printed circuit board of claim 10, wherein the one or more layers comprises at least one additional prepreg layer.

12. The printed circuit board of claim 1, wherein the first balance material layer is adjacent to the centerline.

13. The printed circuit board of claim 1, wherein the first and second balance material layers are non-conductive.

14. The printed circuit board of claim 1, wherein the centerline represents an approximate midpoint of a thickness of the printed circuit board.

* * * * *